(12) United States Patent
Katayama

(10) Patent No.: US 11,908,518 B2
(45) Date of Patent: Feb. 20, 2024

(54) MEMORY SYSTEM

(71) Applicant: Kioxia Corporation, Tokyo (JP)

(72) Inventor: Akira Katayama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 134 days.

(21) Appl. No.: 17/684,502

(22) Filed: Mar. 2, 2022

(65) Prior Publication Data

US 2023/0087475 A1      Mar. 23, 2023

(30) Foreign Application Priority Data

Sep. 17, 2021   (JP) .................................. 2021-152198

(51) Int. Cl.
*G11C 13/00*   (2006.01)
*G11C 5/06*    (2006.01)

(52) U.S. Cl.
CPC .............. *G11C 13/004* (2013.01); *G11C 5/06* (2013.01); *G11C 13/0038* (2013.01); *G11C 13/0069* (2013.01)

(58) Field of Classification Search
CPC .............................. G11C 13/004; G11C 13/04
USPC ....................................................... 365/148
See application file for complete search history.

(56) References Cited

U.S. PATENT DOCUMENTS

| | | | |
|---|---|---|---|
| 10,892,000 B2 | 1/2021 | Katayama | |
| 2007/0171705 A1 | 7/2007 | Parkinson | |
| 2017/0243918 A1 | 8/2017 | Terai et al. | |
| 2019/0267082 A1* | 8/2019 | Parkinson | G11C 13/004 |
| 2020/0090723 A1 | 3/2020 | Katayama | |
| 2020/0118611 A1 | 4/2020 | Keshtbod et al. | |
| 2020/0312395 A1 | 10/2020 | Takizawa | |
| 2021/0012835 A1 | 1/2021 | Cho et al. | |
| 2021/0082486 A1 | 3/2021 | Fujino | |
| 2021/0090629 A1* | 3/2021 | Hatsuda | G11C 11/1655 |

(Continued)

FOREIGN PATENT DOCUMENTS

| | | | |
|---|---|---|---|
| JP | 2015228271 A | 12/2015 | |
| JP | 2020047317 A | 3/2020 | |

(Continued)

OTHER PUBLICATIONS

U.S. Appl. No. 17/200,966; First Named Inventor: Akira Katayama; Title: "Memory Device"; filed Mar. 15, 2021.

*Primary Examiner* — Muna A Techane
(74) *Attorney, Agent, or Firm* — Holtz, Holtz & Volek PC

(57) ABSTRACT

A memory system according to an embodiment includes a first wiring, a second wiring, a memory cell between the first wiring and the second wiring and a controller. The memory cell includes a variable resistance element and a switching element. The variable resistance element is switchable between a first low-resistance state and a first high-resistance state. The switching element is switchable between a second low-resistance state and a second high-resistance state in accordance with a supplied voltage. The controller is configured to supply the first wiring with a first voltage switching the switching element to the second low-resistance state, supply the first wiring with a second voltage switching the switching element from the second low-resistance state to the second high-resistance state after the first voltage is supplied, and detect a first target voltage of the second wiring after the second voltage is supplied.

11 Claims, 23 Drawing Sheets

(56) References Cited

U.S. PATENT DOCUMENTS

2021/0090651 A1    3/2021  Kim et al.
2022/0101937 A1*   3/2022  Ogle ................ G11C 29/56008

FOREIGN PATENT DOCUMENTS

| JP | 2020161201 A | 10/2020 |
| JP | 2021047950 A | 3/2021 |
| JP | 2021048184 A | 3/2021 |
| TW | 201730880 A | 9/2017 |

* cited by examiner

MEMORY SYSTEM

CROSS REFERENCE TO RELATED APPLICATIONS

This application is based upon and claims the benefit of priority from the prior Japanese Patent Application No. 2021-152198 filed on Sep. 17, 2021, the entire contents of which are incorporated herein by reference.

FIELD

Embodiments of the present disclosures relates to a memory system arranged with a memory device.

BACKGROUND

A memory system has been proposed which includes a memory device in which resistance change type memory elements and the like are integrated on a semiconductor substrate.

DETAILED DESCRIPTION

Figure 1:
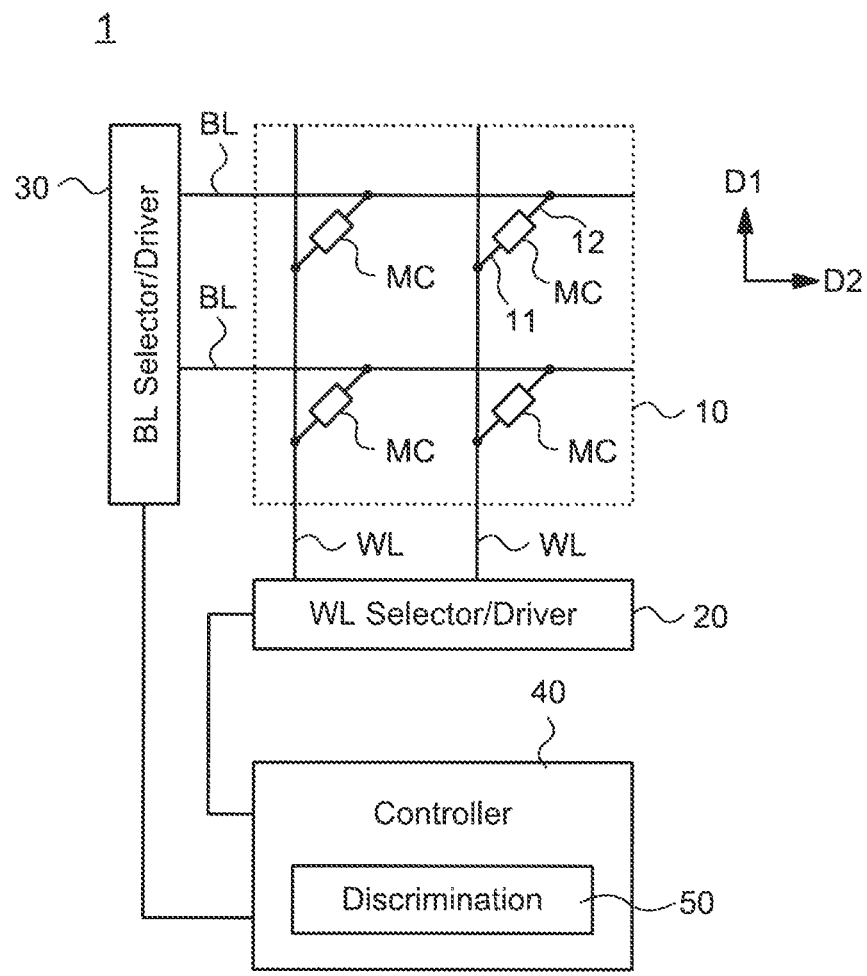
FIG. 1 is a block diagram showing an overall configuration of a memory system according to an embodiment.

The problem to be solved by an embodiment is to provide a memory system capable of performing a stable read operation.

A memory system according to an embodiment includes: a first wiring extending in a first direction; a second wiring extending a second direction intersecting with the first direction; a memory cell connected to the first wiring and the second wiring between the first wiring and the second wiring, the memory cell including a variable resistance element and a switching element which are connected in series; and a controller. A resistance state of the variable resistance element is switchable between a first low-resistance state and a first high-resistance state. A resistance state of the switching element is switchable between a second low-resistance state and a second high-resistance state in accordance with a supplied voltage. The resistance of the second low-resistance state is lower than a resistance of the first low-resistance state. A resistance of the second high-resistance state is higher than a resistance of the first high-resistance state. The switching element is a two terminal type element. The controller is configured to supply the first wiring with a first voltage switching the switching element to the second low-resistance state, supply the first wiring with a second voltage switching the switching element from the second low-resistance state to the second high-resistance state after the first voltage is supplied, and detect a first target voltage of the second wiring after the second voltage is supplied.

Hereinafter, a semiconductor memory device according to the present embodiment will be described in detail by referring to the drawings. In the following description, components having substantially the same functions and configurations are denoted by the same reference numerals, and will be described redundantly only when necessary. Each of the embodiments described below exemplifies a device and a method for embodying a technical idea of this embodiment. The technical idea of the embodiment is not specified by the materials, shapes, structures, arrangements, and the like of the components described below. Various modifications may be made to the technical idea of the embodiment in addition to the scope of the claims.

In each embodiment of the present disclosures, a direction from a variable resistance element 101 toward a switching element 102 is referred to as upper or above. On the contrary, a direction from the switching element 102 toward the variable resistance element 101 is referred to as lower or below. Thus, for convenience of explanation, although the phrase above or below will be used for explanation, for example, the variable resistance element 101 and the switching element 102 may be arranged so that the vertical relationship between them is opposite to that shown in the drawings. In the following description, for example, an expression "the switching element 102 above the variable resistance element 101" only describes the vertical relationship between the variable resistance element 101 and the switching element 102 as described above, and other members may be arranged between the variable resistance element 101 and the switching element 102. Above or below means a stacking order in a structure in which a plurality of layers are stacked. In the case of the expression a bit line BL above a word line WL, it may be a positional relationship whereby the word line WL and the bit line BL do not overlap in a plan view. On the other hand, in the case of the expression a bit line BL vertically above a word line WL, it means a positional relationship whereby the word line WL and the bit line BL overlap in a plan view.

The expressions "a includes A, B, or C", "α includes any of A, B, and C", and "α includes one selected from a group consisting of A, B, and C" do not exclude the case where a includes α plurality of combinations of A to C unless otherwise specified. Furthermore, these expressions do not exclude the case where α includes other elements.

In the following description, although "voltage" refers to a potential difference between two terminals, "voltage" may refer to a potential with respect to a ground voltage or a voltage VSS.

1. First Embodiment

A memory system according to the first embodiment will be described with reference to FIG. 1 to FIG. 8. A memory system 1 according to the first embodiment includes, for example, a memory cell array 10 in which a plurality of memory cells MC are arranged, and a control circuit 40 that controls the memory cells MC.

[1-1. Overall Configuration of Memory System]

An overall configuration of the memory system according to the first embodiment will be described with reference to FIG. 1. FIG. 1 is a block diagram showing an overall configuration of a memory system according to an embodiment. As shown in FIG. 1, the memory system 1 includes the memory cell array 10, a word line select/drive circuit 20 (WL Selector/Driver), a bit line select/drive circuit 30 (BL Selector/Driver), and the control circuit 40 (Controller).

The memory cell array 10 is provided with the plurality of memory cells MC, a plurality of word lines WL, and a plurality of bit lines BL. The word line WL extends in a direction D1. The bit line BL extends in a direction D2. The memory cell MC is provided between the word line WL and the bit line BL and is electrically connected to the word line WL and the bit line BL. The memory cell MC is a two-terminal type memory cell. A first terminal 11 of the memory cell MC is connected to the word line WL. A second terminal 12 of the memory cell MC is connected to the bit line BL. The word line WL and the bit line BL intersect, as will be described later. The memory cell MC is provided at a position where the word line WL and the bit line BL intersect.

A configuration in which the D1 direction and the D2 direction are orthogonal to each other is exemplified in FIG. 1. However, the D1 direction and the D2 may intersect at an angle not orthogonal to each other. A configuration in which the word line WL is linearly extended in the direction D1 is exemplified in FIG. 1. However, it is not necessary that the word line WL be linear. The word line WL may extend in the direction D1 when the entire word line WL is viewed. A configuration in which the bit line BL extends linearly in the direction D2 is exemplified in FIG. 1. However, it is not necessary that the bit line BL be linear. The bit line BL may extend in the direction D2 when the entire bit line BL is viewed.

One word line WL and one bit line BL are selected from the plurality of word lines WL and the plurality of bit lines BL, respectively, to specify the memory cell MC that is a target of a write operation and a read operation. Specifically, by applying a predetermined voltage to the specific word line WL and the bit line BL, a predetermined current flows through the memory cell MC. The write operation and the read operation for the memory cell MC are executed by passing through a predetermined current to the memory cell MC.

The word line select/drive circuit 20 is provided at a position adjacent to the memory cell array 10 in the D1 direction. The word line WL is connected to the word line select/drive circuit 20.

The bit line select/drive circuit 30 is provided at a position adjacent to the memory cell array 10 in the D2 direction. The bit line BL is connected to the bit line select/drive circuit 30.

The control circuit 40 is connected to the word line select/drive circuit 20 and the bit line select/drive circuit 30. The control circuit 40 includes a discrimination circuit 50.

The control circuit 40 executes the write operation and the read operation in response to a command. The control circuit 40 supplies a control signal to the word line select/drive circuit 20 and the bit line select/drive circuit 30 according to an address specified in the write operation and the read operation. In response to the control signal, the word line select/drive circuit 20 and the bit line select/drive circuit 30 select the word line WL and the bit line BL corresponding to the specified address, respectively. The word line select/drive circuit 20 and the bit line select/drive circuit 30 apply a write voltage or a read voltage to the selected word line WL and bit line BL, respectively.

The discrimination circuit 50 discriminates a data value stored in the memory cell MC based on the voltage (read voltage) of the memory cell MC obtained by the read operation. As will be described later, the memory cell MC includes the variable resistance element 101 and stores binary data depending on a resistance state (low-resistance state or high-resistance state) of the variable resistance element 101. Discrimination of the data stored in the memory cell MC is carried out by discrimination of the resistance state of the variable resistance element 101 by the discrimination circuit 50.

[1-2. Configuration of Memory Cell Array 10]

Figure 2:
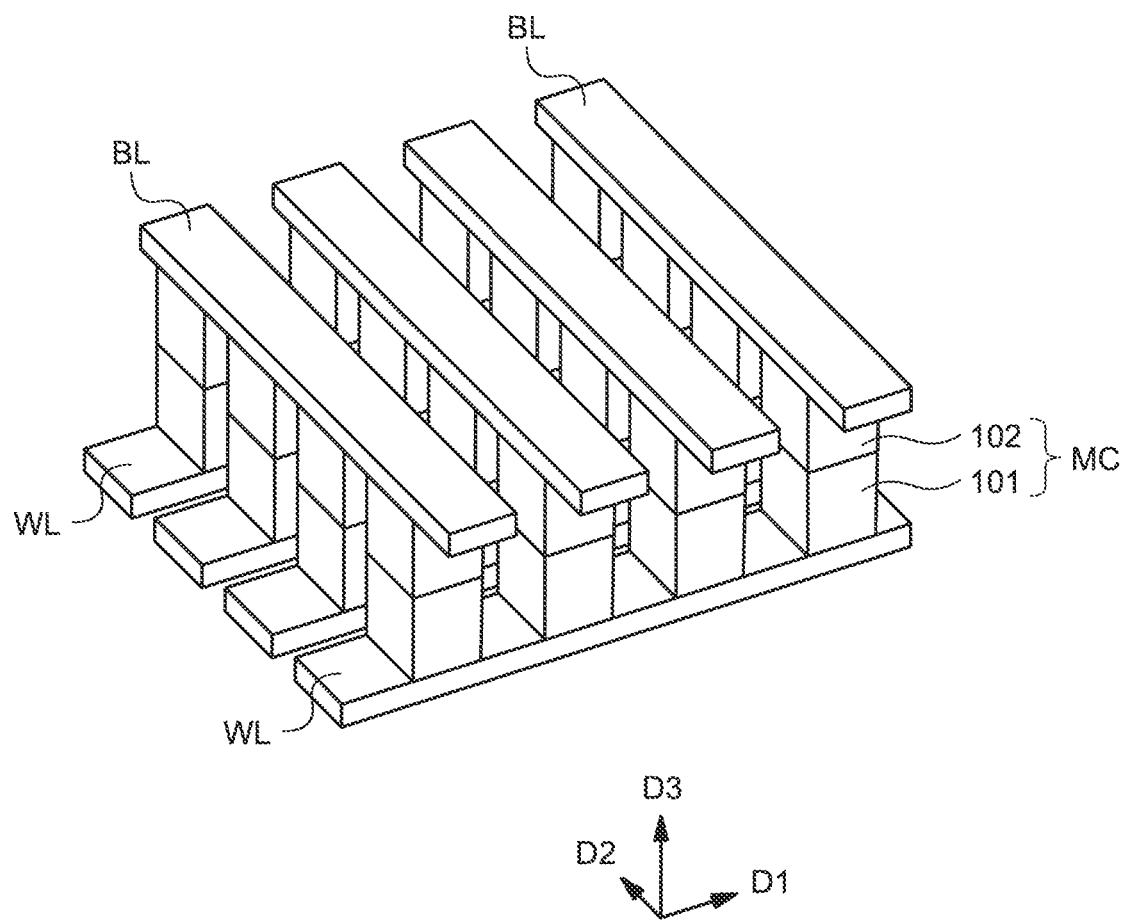
FIG. 2 is a perspective view schematically showing a configuration of a memory cell according to an embodiment.

FIG. 2 is a perspective view schematically showing a configuration of a memory cell according to an embodiment. As shown in FIG. 2, the memory cell MC is provided above the word line WL (D3 direction). The bit line BL is provided above the memory cell MC (D3 direction). In other words, the memory cell MC is provided between the word line WL and the bit line BL in a region where the word line WL and the bit line BL provided in different layers intersect.

The memory cell MC includes the variable resistance element 101 and the switching element 102. The variable resistance element 101 and the switching element 102 are connected in series between the word line WL and the bit line BL. The variable resistance element 101 is provided on the word line WL side of the memory cell MC, and the switching element 102 is provided on the bit line BL side of the memory cell MC.

The resistance state of the variable resistance element 101 is a memory element that can be switched to a low-resistance state or a high-resistance state. The low-resistance state of the variable resistance element 101 may be referred to as a "first low resistance state". The high-resistance state of the variable resistance element 101 may be referred to as a "first high-resistance state". In the present embodiment, a configuration in which a magnetoresistance effect element including a magnetic tunnel junction (MTJ) is used as the variable resistance element 101 will be described. Thereafter, the magnetoresistance effect element may be referred to as an MTJ element. The MTJ element is a memory element in which the resistance (tunnel resistance) due to a tunnel effect in an insulating layer varies according to the relationship (parallel or non-parallel) of a magnetization direction of each of the two adjacent magnetic layers via the insulating layer. That is, the MTJ element includes a plurality of resistance states (resistance values) which depend on the relative relationship between the direction of magnetization of one magnetic layer and the direction of magnetization of another magnetic layer (magnetization arrangement).

The switching element 102 is a two-terminal type element. The switching element is switched to the low-resistance state or the high-resistance state depending on the voltage applied to the two terminals. The switching element is a bidirectional switching element. By turning the switching element on or off, it is possible to perform control as to whether or not to supply a current to an MTJ element coupled to the switching element, namely, whether or not to select the MTJ element. The low-resistance state of the switching element 102 may be referred to as a "second low resistance state". The high-resistance state of the switching element 102 may be referred to as a "second high-resistance state". The resistance in the second low-resistance state is lower than the resistance in the first low resistance state of the variable resistance element 101 described above. The resistance in the second high-resistance state is higher than the resistance in the first high-resistance state of the variable resistance element 101 described above. That is, in the case where the switching element 102 is in the second high-resistance state, the resistance of the memory cell MC is substantially determined by the resistance of the switching element 102. On the other hand, in the case where the switching element 102 is in the second low-resistance state, the resistance of the memory cell MC is substantially determined by the resistance of the variable resistance element 101.

Unlike the configuration in FIG. 2, the variable resistance element 101 may be provided on the bit line BL side of the memory cell MC. The switching element 102 may be provided on the word line WL side of the memory cell MC. The word line WL may be provided above the switching element 102 (D3 direction). The bit line BL may be provided below the variable resistance element 101 (the opposite direction of the D3 direction). Other members may be provided between the word line WL and the variable resistance element 101. Similarly, other members may be provided between the bit line BL and the switching element 102.

In the present embodiment, although the configuration in which the MTJ element is used as the variable resistance element 101 is described, a variable resistance element other than the MTJ element may be used as the variable resistance element 101. For example, a resistive random access memory (ReRAM), a ferroelectric random access memory (FeRAM), an organic memory, and a phase-change memory element (PRAM) may be used as the variable resistance element 101.

[1-3. Configuration of MTJ Element]

Figure 3:
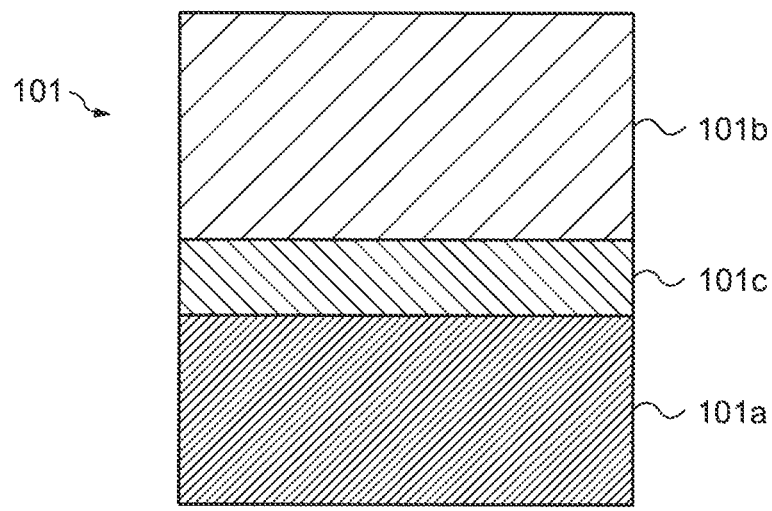
FIG. 3 is a cross-sectional view schematically showing a configuration of a variable resistance element according to an embodiment.
Figure 3:

FIG. 3 is a cross-sectional view schematically showing a configuration of a variable resistance element according to an embodiment. As shown in FIG. 3, the MTJ element used as the variable resistance element 101 includes a memory layer 101a, a reference layer 101b, and a tunnel barrier layer 101c. The memory layer 101a, the memory layer 101b and the non-magnetic layer 101c form the magnetic tunnel junction (MTJ). The memory layer 101a is a ferromagnetic layer having a first magnetism. The reference layer 101b is a ferromagnetic layer having a second magnetism. Examples of the memory layer 101a and the memory layer 101b include a ferromagnetic layer including (containing), for example, iron cobalt boron (FeCoB) or iron boride (FeB) etc. The tunnel barrier layer 101c is a nonmagnetic layer. Examples of the tunnel barrier layer 101c include an insulation layer including (containing) oxygen and magnesium or magnesium oxide etc. The magnetization direction of the memory layer 101a is variable. The magnetization direction of the reference layer 101b is fixed. The magnetization direction of the memory layer 101a is changed by a write current supplied to the memory layer 101a. The magnetization direction of the memory layer 101a is determined by the direction of the write current. On the other hand, the magnetization direction of the reference layer 101b is not changed even if the write current is supplied to the reference layer 101b. The tunnel barrier layer 101c is an insulating layer. The expression "magnetization direction is variable" means that the magnetization direction is changeable between before the write current is supplied (before writing) and after the write current is supplied (after writing). "The magnetization direction is fixed" means that the magnetization direction does not change before the write current is supplied (before writing) and after the write current is supplied (after writing).

In the case where the magnetization direction of the memory layer 101a is parallel to the magnetization direction of the reference layer 101b (in the case where the magnetization direction is the same direction), the MTJ element is in the low-resistance state. In the case where the magnetization direction of the memory layer 101a is antiparallel to the magnetization direction of the reference layer 101b (in the case where the magnetization directions are opposite), the MTJ element is in the high-resistance state. As described above, since the resistance state (low-resistance state or high-resistance state) is controlled by the magnetization direction of the memory layer 101a, different binary data can be stored in the MTJ element based on the resistance state.

Although a configuration of a bottom-free MTJ element in which the memory layer 101a provided below the reference layer 101b is used as the variable resistance element 101 is exemplified in FIG. 3, the present embodiment is not limited to this configuration. A top-free MTJ element in which the memory layer 101a is provided above the reference layer 101b may be used as the variable resistance element 101. The MTJ element may further include a shift canceling layer that cancels a magnetic field applied from the reference layer 101b to the memory layer 101a.

[1-4. Electrical Characteristics of Switching Element]

Figure 4:
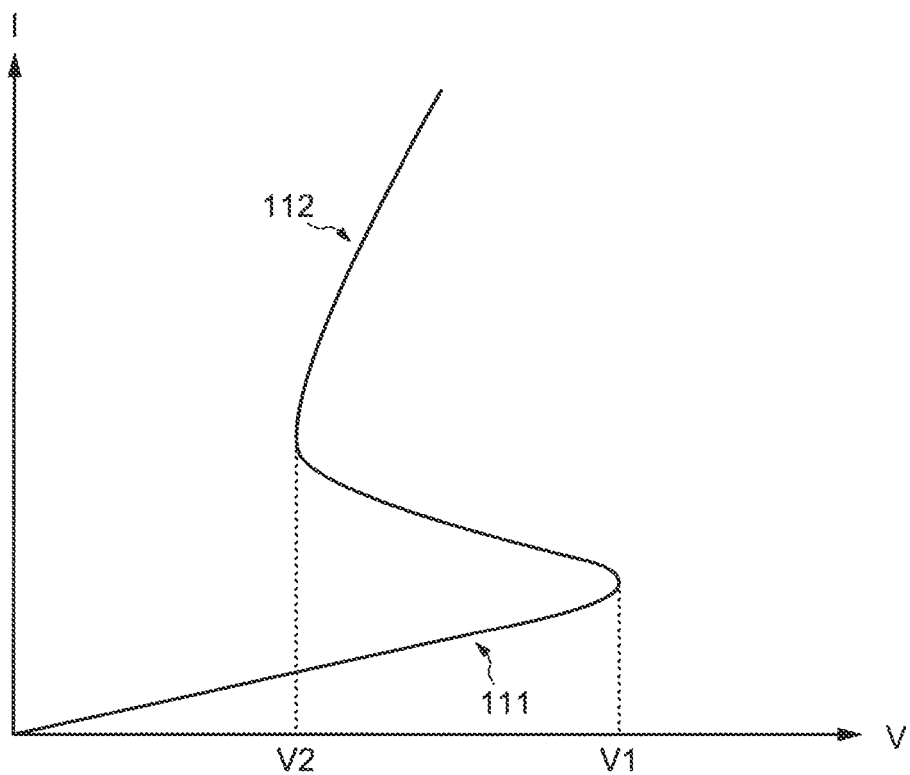
FIG. 4 is a diagram showing electrical characteristics of a switching element according to an embodiment.

FIG. 4 is a diagram showing electrical characteristics of a two-terminal type switching element according to an embodiment. As shown in FIG. 4, the resistance state of the switching element 102 is switched from a high-resistance state 111 to a low-resistance state 112 when the voltage applied between two terminals increases and reaches a first voltage V1. The resistance state of the switching element 102 has a characteristic that when the resistance state of the switching element 102 is switched to the low-resistance state 112, the voltage between the two terminals shifts to a second voltage V2 lower than the first voltage V1, and the current rapidly increases. Furthermore, the switching element 102 has a characteristic that when the voltage applied between two terminals is reduced and reaches the second voltage V2, it is switched from the low-resistance state 112 to the high-resistance state 111. That is, although the switching element 102 follows a negative resistance region between the voltage V1 and the voltage V2 when switched from the high-resistance state 111 to the low-resistance state 112, the resistance state of the switching element 102 shifts to the high-resistance state 111 without following the negative resistance region when switched from the low-resistance state 112 to the high-resistance state 111. The switching element 102 has electrical characteristics symmetrical to each other in both directions (positive direction and negative direction).

The switching element 102 of the present embodiment, as an example, has the characteristic that the resistance value drops sharply at the voltage V1 as described above, with which the applied voltage drops sharply, and the current increases (snaps back). The switching element 102 of the present embodiment is a two-terminal type switching element. The materials used in the switching element having such characteristics are appropriately selected in accordance with the characteristics of the memory cell.

By applying a predetermined voltage between the word line WL and the bit line BL to switch the switching element 102 to the low-resistance state, it is possible to perform the write operation and the read operation for the variable resistance element 101.

[1-5. Electrical Characteristics of Memory Cell MC]

Figure 5:
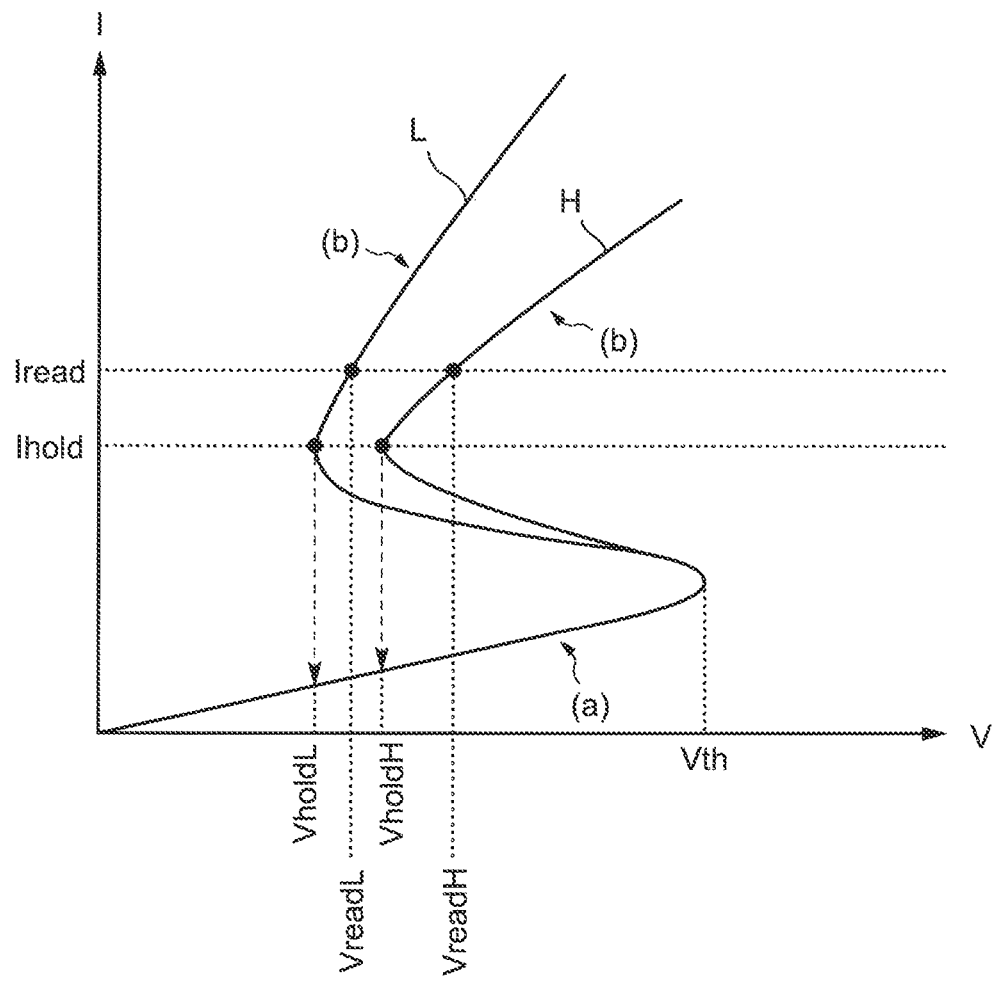
FIG. 5 is a diagram showing electrical characteristics of a memory cell in a read operation according to an embodiment.

FIG. 5 is a diagram schematically showing electrical characteristics of a selected memory cell MC when the reading operation is executed. In FIG. 5, the horizontal axis indicates the voltage between the two terminals of the selected memory cell MC (the voltage applied between the word line WL and the bit line BL), and the vertical axis indicates the current flowing through the selected memory cell MC. A characteristic (L) is a characteristic when the variable resistance element 101 is in the low-resistance state. A characteristic (H) is a characteristic when the variable resistance element 101 is in the high-resistance state.

As described above, the resistance of the switching element 102 in the high-resistance state is higher than the resistance of the variable element 101 in the high-resistance state. In this case, the resistance of the memory cell MC is substantially determined by the resistance of the switching element 102. Therefore, the electrical characteristic (corresponding to a characteristic portion (a)) of the memory cell MC before the resistance state of the switching element 102 is switched from the high-resistance state to the low-resistance state is substantially the same even when the variable resistance element 101 is in the low-resistance state or the high-resistance state. That is, there is substantially no difference in the voltage (threshold voltage Vth) applied between the two terminals of the memory cell MC when the resistance state of the switching element 102 is switched from the high-resistance state to the low-resistance state regardless of whether the switching element 102 is in the low-resistance state or the high-resistance state.

On the other hand, since the resistance of the switching element 102 in the low-resistance state is lower than the resistance of the variable resistance element 101 in the low-resistance state, the resistance of the memory cell MC is substantially determined by the resistance of the variable resistance element 101 after the switching element 102 is switched from the high-resistance state to the low-resistance state. Therefore, in the electrical characteristic (corresponding to a characteristic portion (b)) of the memory cell MC after the resistance state of the switching element 102 is switched from the high-resistance state to the low-resistance state, the electrical characteristic in the case where the variable resistance element 101 is in the low-resistance state differs from the electrical characteristic in the case where the variable resistance element 101 is in the high-resistance state. Specifically, for the voltage-current gradient in the characteristic portion (b), the gradient in the case where the variable resistance element 101 is in the high-resistance state is smaller than the gradient in the case where the variable resistance element 101 is in the low-resistance state.

As shown in FIG. 5, with respect to a read current Iread in the read operation, the read voltage in the case where the variable resistance element 101 is in the low-resistance state is VreadL, and the read voltage in the case where the variable resistance element 101 is in the high-resistance state is VreadH. The read voltage VreadL is smaller than the read voltage VreadH. Based on the difference between the read voltage VreadL and the read voltage VreadH, it is possible to discriminate the resistance state of the variable resistance element 101 (low-resistance state or high-resistance state).

In FIG. 5, a hold current Ihold is a current flowing through the memory cell MC when the switching element 102 is switched from the low-resistance state to the high-resistance state. A hold voltage Vhold is a voltage applied between the two terminals of the memory cell MC when the hold current Ihold flows through the memory cell MC. The hold voltage in the case where the variable resistance element 101 is in the low-resistance state is VholdL. The hold voltage in the case where the variable resistance element 101 is in the high-resistance state is VholdH. Unless the hold voltages VholdL and VholdH are specifically distinguished, they are simply referred to as the hold voltage Vhold.

As described above, the voltage-current gradient in the case where the variable resistance element 101 is in the high-resistance state differs from the voltage-current gradient in the case where the variable resistance element 101 is in the low-resistance state. Therefore, the difference between the read voltages VreadH and VreadL is larger than the difference between the hold voltages VholdH and VholdL. Similarly, the larger Iread is, the greater the difference between the read voltages VreadH and VreadL.

[1-6. Functional Configuration of Discrimination Circuit]

Figure 6:
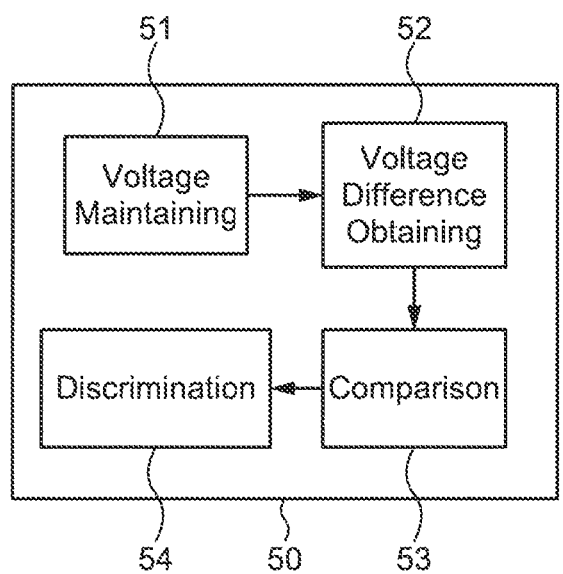
FIG. 6 is a block diagram showing a functional configuration of a discrimination circuit included in a memory system according to an embodiment.

FIG. 6 is a block diagram showing a functional configuration of a discrimination circuit included in a memory system according to an embodiment. As shown in FIG. 6, the discrimination circuit 50 includes a voltage maintaining unit 51 (Voltage Maintaining), a voltage difference obtaining unit 52 (Voltage Difference Obtaining), a comparison unit 53 (Comparison), and a discrimination unit 54 (Discrimination).

The voltage maintaining unit 51 holds the read voltage (VreadL or VreadH) obtained by the read operation of the memory cell MC as a determination target voltage. As described above, the read operation of the data stored in the memory cell MC may be referred to as a "first read operation". The determination target voltage may be referred to as a "first target voltage".

Further, the voltage maintaining unit 51 holds a reference voltage for performing data discrimination on the discrimination target voltage. The reference voltage is obtained by a second read operation performed after the first read operation. The reference voltage may be referred to as a "second target voltage". The write operation to the variable resistance element 101 is performed after the first read operation described above. The second read operation is performed after the variable resistance element 101 is switched to the low-resistance state or high-resistance state. The resistance state of the variable resistance element 101 when the first read operation is performed may be referred to as a "discrimination target resistance state", and the resistance state of the variable resistance element 101 when the second read operation is performed may be referred to as a "reference resistance state".

The voltage difference obtaining unit 52 obtains a voltage difference between the discrimination target voltage and the reference voltage held by the voltage maintaining unit 51.

The comparison unit 53 compares the voltage difference obtained by the voltage difference obtaining unit 52 and the reference voltage difference. The reference voltage difference is, for example, a value obtained by multiplying the voltage difference between the read voltage VreadL in the case where the variable resistance element 101 is in the low-resistance state and the read voltage VreadH in the case where the variable resistance element 101 is in the high-resistance state by ½.

The discrimination unit 54 discriminates the resistance state of the variable resistance element 101 based on the comparison result obtained by the comparison unit 53. Specifically, in the case where the voltage difference between the discrimination target voltage and the reference voltage is smaller than the reference voltage difference, it is discriminated that the discrimination target resistance state of the variable resistance element 101 is the same as the reference resistance state. In the case where the voltage difference between the discrimination target voltage and the reference voltage is greater than the reference voltage difference, it is discriminated that the discrimination target resistance state of the variable resistance element 101 is a resistance state that differs from the reference resistance state.

[1-7. Read Operation of Memory System 1]

FIG. 7A to FIG. 7E are schematic diagrams showing details of a read operation of a memory system according to an embodiment. A voltage obtaining operation is performed by the control circuit 40 including the discrimination circuit 50 shown in FIG. 1.

Figure 7A:
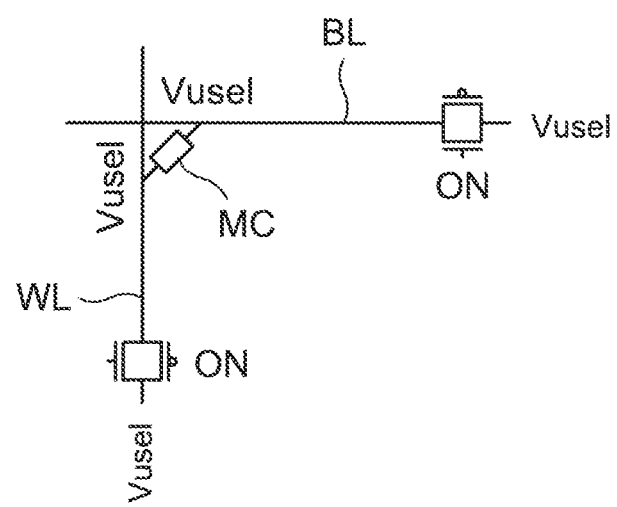
FIG. 7A is a schematic diagram showing a detail of a read operation of a memory system according to an embodiment.

First, as shown in FIG. 7A, drivers connected to the word line WL and the bit line BL respectively are controlled to be ON, and a voltage Vusel is applied to both the word line WL and the bit line BL. The voltage Vusel is a voltage of about half the threshold voltage Vth described above. In the state shown in FIG. 7A, the voltage applied to the memory cell MC is 0V.

Figure 7B:
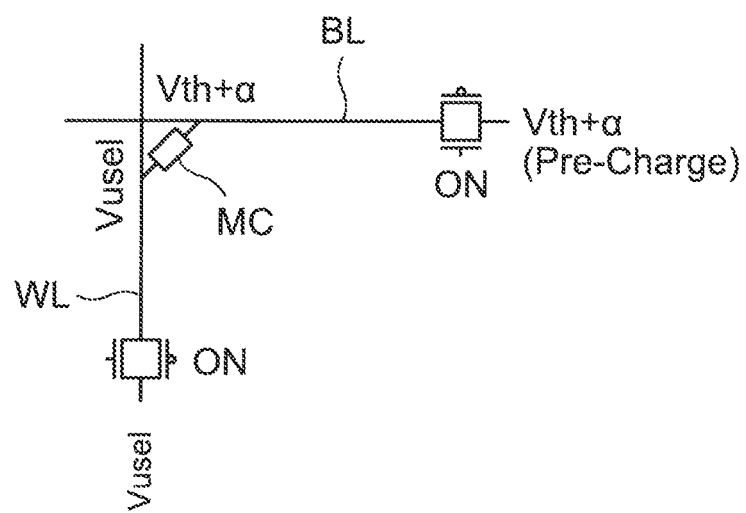
FIG. 7B is a schematic diagram showing details of a read operation of a memory system according to an embodiment.

Next, as shown in FIG. 7B, a voltage (Vth+α) higher than the threshold voltage Vth is applied to the bit line BL. The voltage (Vth+α) is applied to the bit line BL, then capacitances formed in the bit line BL are charged. This operation may be referred to as pre-charging. The voltage of the word line WL is maintained at the voltage Vusel. In the state shown in FIG. 7B, the voltage applied to the memory cell MC is [(Vth+α)–Vusel]. The capacitances formed in the bit line BL may be an intentionally formed capacitance or a parasitic capacitance formed between the bit line BL and another conductive layer.

Figure 7C:
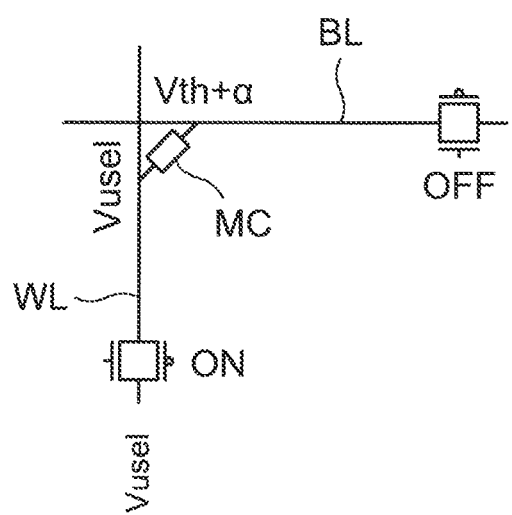
FIG. 7C is a schematic diagram showing details of a read operation of a memory system according to an embodiment.

Next, as shown in FIG. 7C, the driver connected to the bit line BL is controlled to be OFF, and the bit line BL is in a floating state. In this state, the voltage of the bit line BL is maintained at (Vth+α). The voltage of the word line WL is maintained at the voltage Vusel.

Figure 7D:
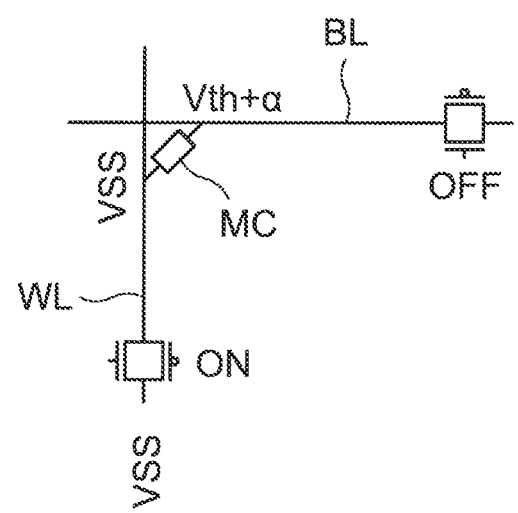
FIG. 7D is a schematic diagram showing details of a read operation of a memory system according to an embodiment.

Next, as shown in FIG. 7D, a voltage VSS (e.g., ground voltage) is applied to the word line WL while the bit line BL is maintained in the floating state. Since the voltage applied to the memory cell MC is the voltage (Vth+α) higher than the threshold voltage Vth, the resistance state of the switching element 102 included in the memory cell MC is switched from the high-resistance state (e.g., non-electrically conductive state) to the low-resistance state (e.g., electrically conductive state).

When the resistance state of the switching element 102 is switched from the high-resistance state to the low-resistance state, charges accumulated in the bit line BL flow to the word line WL via the memory cell MC. Since the bit line BL is maintained in the floating state, the charges of the bit line BL flow through the word line WL so that the potential of the bit line BL gradually drops.

In this case, by maintaining the potential of the bit line BL in the floating state, the potential of the bit line BL drops to the hold voltage Vhold (see FIG. 5). When the potential of the bit line BL drops, the resistance state of the switching element 102 is switched from the low-resistance state to the high-resistance state, and the potential of the bit line BL is stabilized at the hold voltage Vhold.

Figure 7E:
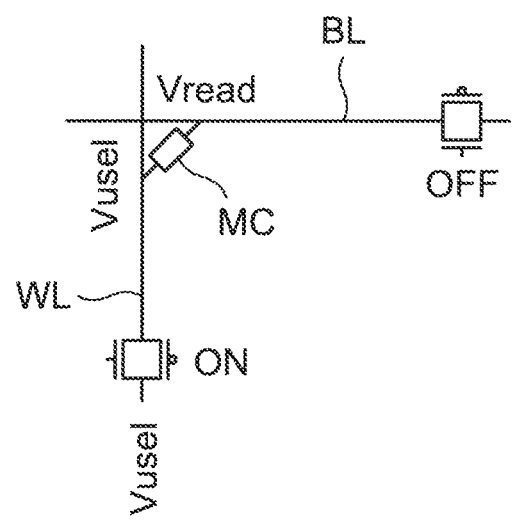
FIG. 7E is a schematic diagram showing details of a read operation of a memory system according to an embodiment.

However, in the present embodiment, as shown in FIG. 7E, the voltage applied to the word line WL is switched from the voltage VSS to the voltage Vusel before the potential of the bit line BL reaches the hold voltage Vhold. This operation forcibly switches the switching element 102 from the low-resistance state to the high-resistance state. That is, the current from the bit line BL to the word line WL is interrupted before the potential of the bit line BL drops to the hold voltage Vhold. Therefore, a state in which the read voltage Vread higher than the hold voltage Vhold is applied to the memory cell MC is maintained. As shown in FIG. 5, the difference between the read voltages VreadH and VreadL is greater than the difference between the holding voltages VholdH and VholdL. Therefore, it is possible to increase the signal amount based on the read voltage.

Figure 8:
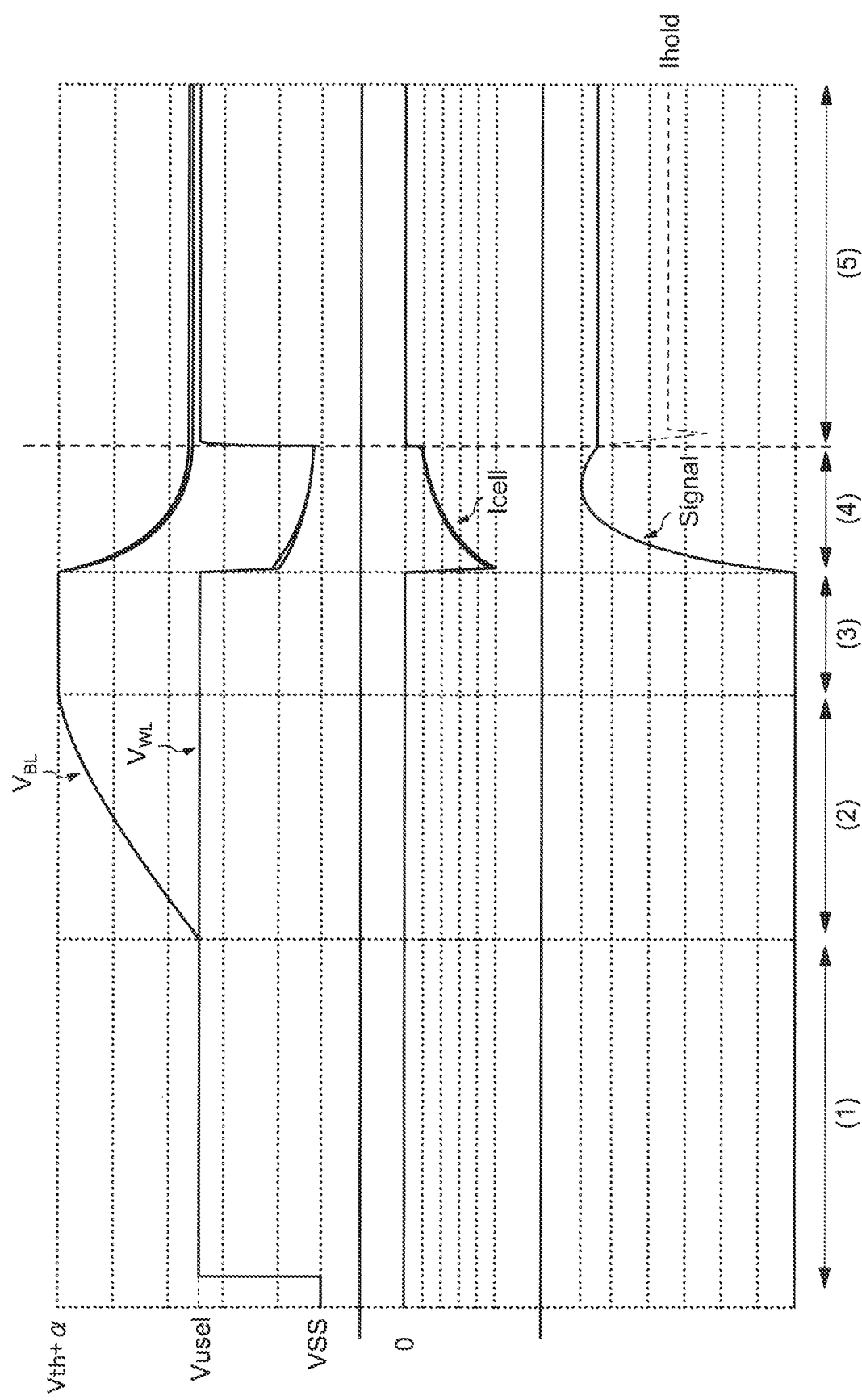
FIG. 8 is a diagram showing a simulation result of a read operation of a memory system according to an embodiment.

FIG. 8 is a diagram showing a simulation result of a read operation of a memory system according to an embodiment. FIG. 8 shows the potential of the bit line BL (bit-line potential $V_{BL}$), the potential of the word line WL (word-line potential $V_{WL}$), the current flowing through the memory cell MC (memory cell current Icell), and the read signal strength (Signal). The read signal strength is determined based on the difference between the read voltages VreadL and VreadH in FIG. 5. For example, the read signal strength is proportional to the difference between the read voltages VreadL and VreadH. The horizontal axis of the simulation result shown in FIG. 8 shows time. The horizontal axis in FIG. 8 is divided into periods (1) to (5).

The period (1) in FIG. 8 is a period corresponding to FIG. 7A. In the period (1), both the bit-line potential $V_{BL}$ and the word-line potential $V_{WL}$ are the voltage Vusel. The period (2) is a period corresponding to FIG. 7B. Pre-charging the bit line BL increases the bit-line potential $V_{BL}$ gradually and reaches the voltage (Vth+α). The period (3) is a period corresponding to FIG. 7C. In the state where the bit-line potential $V_{BL}$ reaches the voltage (Vth+α), the bit line BL is in the floating state. In this case, the charges charged by the pre-charge are held in the capacitance formed in the bit line BL.

The period (4) is a period corresponding to FIG. 7D. Supplying the voltage VSS to the word line WL switches the switching element 102 of the memory cell MC from the high-resistance state to the low-resistance state. The bit-line potential $V_{BL}$ and the word-line potential $V_{WL}$ start to drop at the beginning of the period (4). However, the bit-line potential $V_{BL}$ and the word-line potential $V_{WL}$ drop slowly by the capacitance formed in the bit line BL and the electrical resistance from the bit line BL to the word line WL. Immediately after the start of the period (4), since the difference between the bit-line potential $V_{BL}$ and the word-line potential $V_{WL}$ is large, the memory cell current Icell is large. The memory cell current Icell at this time is referred to as a peak current. Since the drop in the bit-line potential $V_{BL}$ is faster than the drop in the word-line potential $V_{WL}$, these potential differences become gradually small. Therefore, as the bit-line potential $V_{BL}$ drops, the memory cell current Icell decreases. The state in which the bit-line potential $V_{BL}$, the word-line potential $V_{WL}$, and the memory cell current Icell change in the period (4) is called a transient state.

As shown in FIG. 8, the read signal strength has a maximum value in this transient state. That is, in the case where the transient state finishes (that is, in the case where the memory cell current Icell reaches the hold current Ihold), the read signal strength becomes small beyond the maximum value (dotted line of the read signal strength shown in the period (5)). Considering the above phenomenon, in the present embodiment, the voltage Vusel is supplied to the word line WL in the middle of this transient state. By supplying the voltage Vusel, the switching element 102 of the memory cell MC is forcibly switched from the low-resistance state to the high-resistance state (the period (5)) before the memory cell current Icell decreases to the hold current Ihold. By such control, it is possible to suppress the decrease in the read signal strength as described above.

Thereafter, by detecting the read voltage Vread of the bit lines BL, the data of the memory cell MC is read. The read operation of the bit line BL is performed in the state where the bit line BL is floating.

In the above configuration, the word line WL may be referred to as a "first wiring". The bit line BL may be referred to as a "second wiring". The voltage VSS applied to the word line WL in the period (4) may be referred to as a "first voltage". The voltage Vusel applied to the word line WL in the period (5) may be referred to as a "second voltage". The low-resistance state of the variable resistance element 101 is referred to as the "first low-resistance state", and its high-resistance state may be referred to as the "first high-resistance state". The low-resistance state of the switching element 102 is referred to as the "second low-resistance state", and its high-resistance state may be referred to as the "second high-resistance state". When the operation in the periods (4) to (5) described above is described in other words, it can be said that the voltage Vusel (the second voltage) which changes the switching element 102 from the "second low-resistance state" to the "second high-resistance state" is supplied after the voltage VSS (the first voltage) which changes the switching element 102 to the "second low-resistance state" is supplied.

In the same manner as described above, when the operation in the periods (4) to (5) is described in other words, it can be said that the voltage Vusel (the second voltage) is supplied to the word line WL (the first wiring) before the voltage of the bit line BL (the second wiring) is changed by the current from the bit line BL (the second wiring) to the word line WL (the first wiring) via the switching element 102 in the second low-voltage state, and before the switching element 102 changed from the "second low-resistance state" to the "second high-resistance state" due to the potential difference between the voltage VSS (the first voltage) supplied to the word line WL (the first wiring) and the voltage of the bit line BL (the second wiring) (that is, by the potential difference dropping to the hold voltage Vhold)".

In the above configuration, the voltage Vusel applied to the word line WL in the periods (1) to (3) may be referred to as a "third voltage". The voltage (Vth+α) applied to the bit line BL in the periods (2) to (3) may be referred to as a "fourth voltage". When the operation in the periods (1) to (4) is described in other words, it can be said that the voltage Vusel (the third voltage) is supplied to the word line WL (the first wiring) in the periods (1) to (3) and the voltage (Vth+α) (the fourth voltage) is supplied to the bit line BL (the second wiring) in the periods (2) to (3) before the voltage VSS (the first voltage) is supplied to the word line WL (the first wiring) in the period (4). The switching element 102 is in the "second high-resistance state" when the potential difference between the bit line BL and the word line WL is the potential difference between the Voltage Vusel (the third voltage) and the voltage (Vth+α) (the fourth voltage). Further, the switching element 102 is in the "second low-resistance state" when the potential difference between the bit line BL and the word line WL is the potential difference between the voltage VSS (the first voltage) and the voltage (Vth+α) (the fourth voltage).

In the present embodiment, although the configuration that the second target voltage (reference voltage) in the second read operation is detected after the first target voltage (discrimination target voltage) in the first read operation is detected and the configuration that the resistance state of the variable resistance element 101 is discriminated by comparing the first target voltage and the second target voltage is exemplified, the present embodiment is not limited to this configuration. For example, the resistance state of the variable resistance element 101 can be discriminated based on the absolute value of the first target voltage detected by the first read operation without performing the second read operation.

2. Second Embodiment

The memory system 1 according to the second embodiment will be described with reference to FIG. 9A to FIG. 11. The memory system according to the second embodiment is similar to the memory system according to the first embodiment. In the following description, a description of the same configuration as that of the memory system according to the first embodiment will be omitted, and mainly, differences from the memory system in the first embodiment will be described.

[2-1. Circuit Configuration of Memory System 1]

FIG. 9A to FIG. 9E are schematic diagrams showing details of a read operation of a memory system according to an embodiment. As shown in these drawings, a constant current circuit CC is connected to a bit line BL via a switch SW1. The constant current circuit CC is a circuit that supplies a set constant current. For example, the constant current circuit CC supplies a constant current to the memory cell MC regardless of the resistance of the memory cell MC (a combined resistance of the variable resistance element 101 and the switching element 102).

[2-1. Read Operation of Memory System 1]

FIG. 9A to FIG. 9E are schematic diagrams showing details of a read operation of a memory system according to an embodiment. The voltage obtaining operation is performed by the control circuit 40 including the discrimination circuit 50 shown in FIG. 1.

Figure 9A:
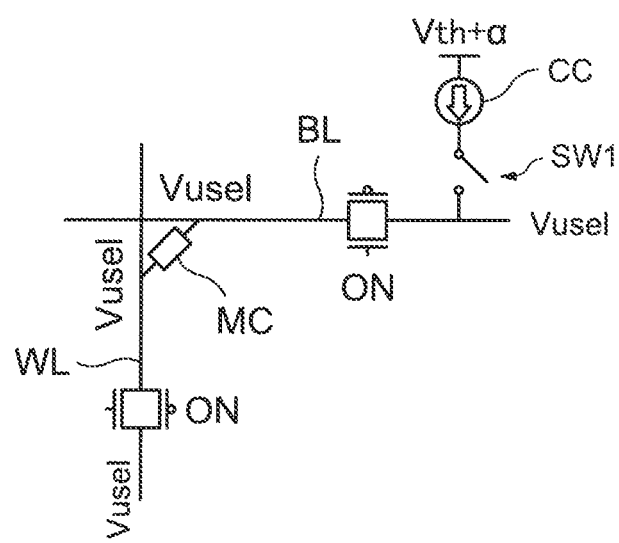
FIG. 9A is a schematic diagram showing details of a read operation of a memory system according to an embodiment.

First, as shown in FIG. 9A, the drivers connected to the word line WL and the bit line BL respectively are controlled to be ON state, and the voltage Vusel is applied to both the word line WL and the bit line BL. Since the switch SW1 is in an OFF state, the constant current circuit CC is not connected to the bit line BL. In the state shown in FIG. 9A, the voltage applied to the memory cell MC is 0V.

Figure 9B:
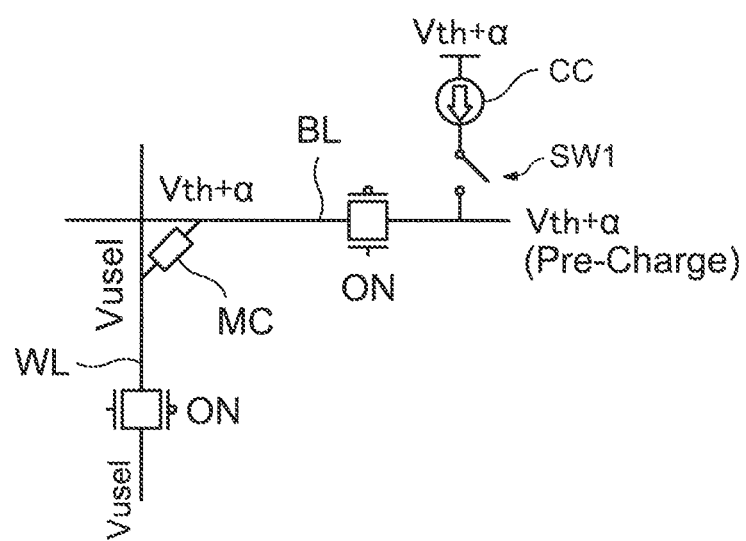
FIG. 9B is a schematic diagram showing details of a read operation of a memory system according to an embodiment.

Next, as shown in FIG. 9B, the voltage (Vth+α) higher than the threshold voltage Vth is pre-charged to the bit line BL. The voltage of the word line WL is maintained at the voltage Vusel. Since the switch SW1 is maintained in an OFF state, the constant current circuit CC is not connected to the bit line BL. In the state shown in FIG. 9B, the voltage applied to the memory cell MC is [(Vth+α)–Vusel].

Figure 9C:
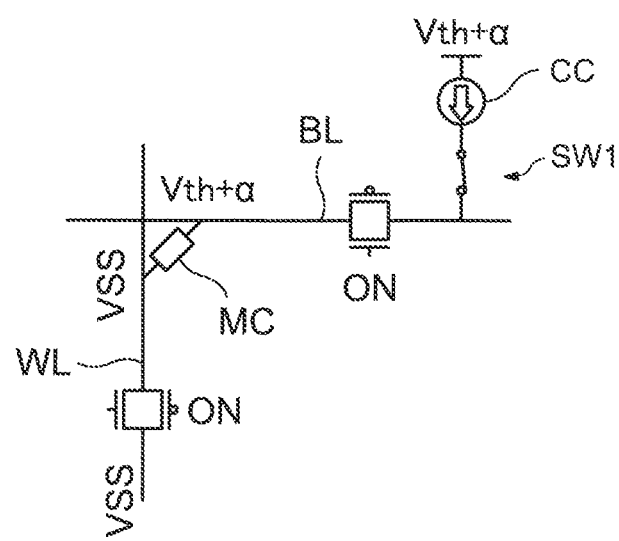
FIG. 9C is a schematic diagram showing details of a read operation of a memory system according to an embodiment.
Figure 9D:
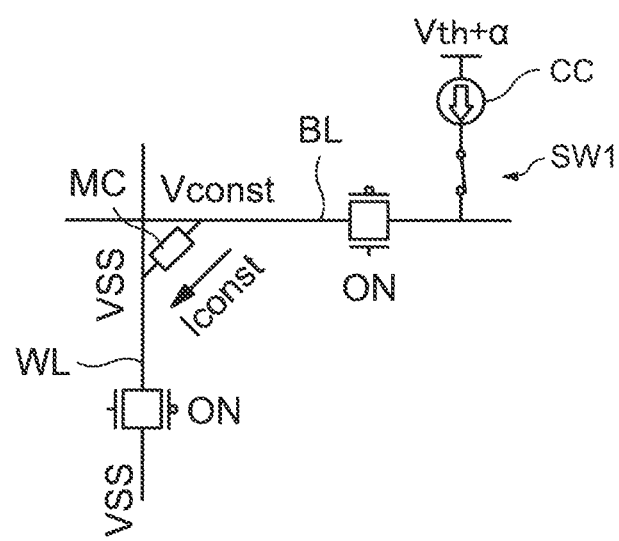
FIG. 9D is a schematic diagram showing details of a read operation of a memory system according to an embodiment.

Next, as shown in FIG. 9C, the voltage VSS (e.g., ground voltage) is applied to the word line WL. Since the voltage applied to the memory cell MC is the voltage (Vth+α) higher than the threshold voltage Vth, the switching element 102 included in the memory cell MC is switched from the high-resistance state to the low-resistance state. In addition, the switch SW1 is switched to an ON state and the constant current circuit CC is connected to the bit line BL. The constant current circuit CC supplies a set constant current Iconst to the memory cell MC. The supplied constant current Iconst is larger than the hold current Ihold. Therefore, as in the first embodiment, when the switching element 102 is switched to the low-resistance state, the potential of the bit line BL is reduced. However, since the constant current circuit CC supplies the constant current Iconst to the memory cell MC, the potential of the memory cell MC is maintained at a potential Vconst (FIG. 9D). In the states shown in FIG. 9C and FIG. 9D, the bit line BL is not connected to a power supply line.

Figure 9E:
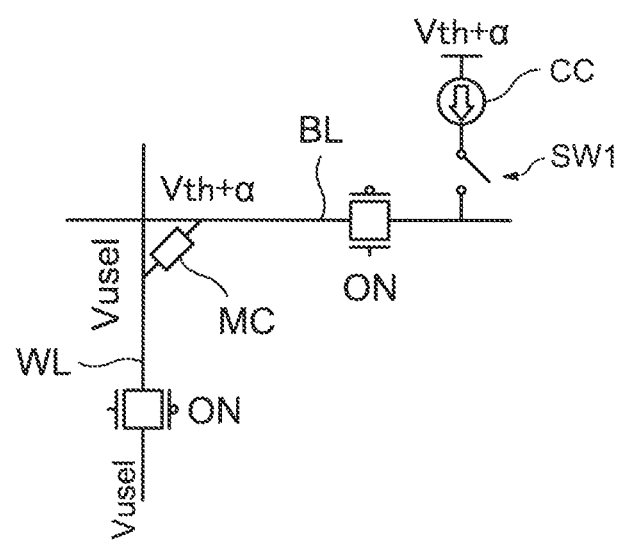
FIG. 9E is a schematic diagram showing details of a read operation of a memory system according to an embodiment.

Next, as shown in FIG. 9E, the voltage applied to the word line WL is switched from the voltage VSS to the voltage Vusel, and the switching element 102 is forcibly switched from the low-resistance state to the high-resistance state. Therefore, the state in which the voltage (Vconst-VSS) is applied to the memory cell MC is maintained. Furthermore, the switch SW1 is switched to an OFF state, and the connection between the constant current circuit CC and the bit line BL is disconnected.

In the present embodiment, as shown in FIG. 9C, although the configuration in which the constant current Iconst is supplied to the bit line BL when the voltage VSS is supplied to the word line WL has been exemplified, the present embodiment is not limited to this configuration. For example, the supply of the voltage VSS to the word line WL and the supply of the constant current Iconst to the bit line BL may be performed simultaneously. The voltage VSS may be supplied to the word line WL after the constant current Iconst is supplied to the bit line BL.

Similarly, as shown in FIG. 9E, although the configuration in which the supply of the constant current Iconst from the constant current circuit CC to the bit line BL is stopped after the voltage Vusel is supplied to the word line WL has been exemplified, the present embodiment is not limited to this configuration. For example, the supply of the voltage Vusel to the word line WL and the supply of the constant current Iconst to the bit line BL may be stopped at the same time. The voltage Vusel may be supplied to the word line WL after the supply of the constant current Iconst from the constant current circuit CC to the bit line BL is stopped.

Figure 10:
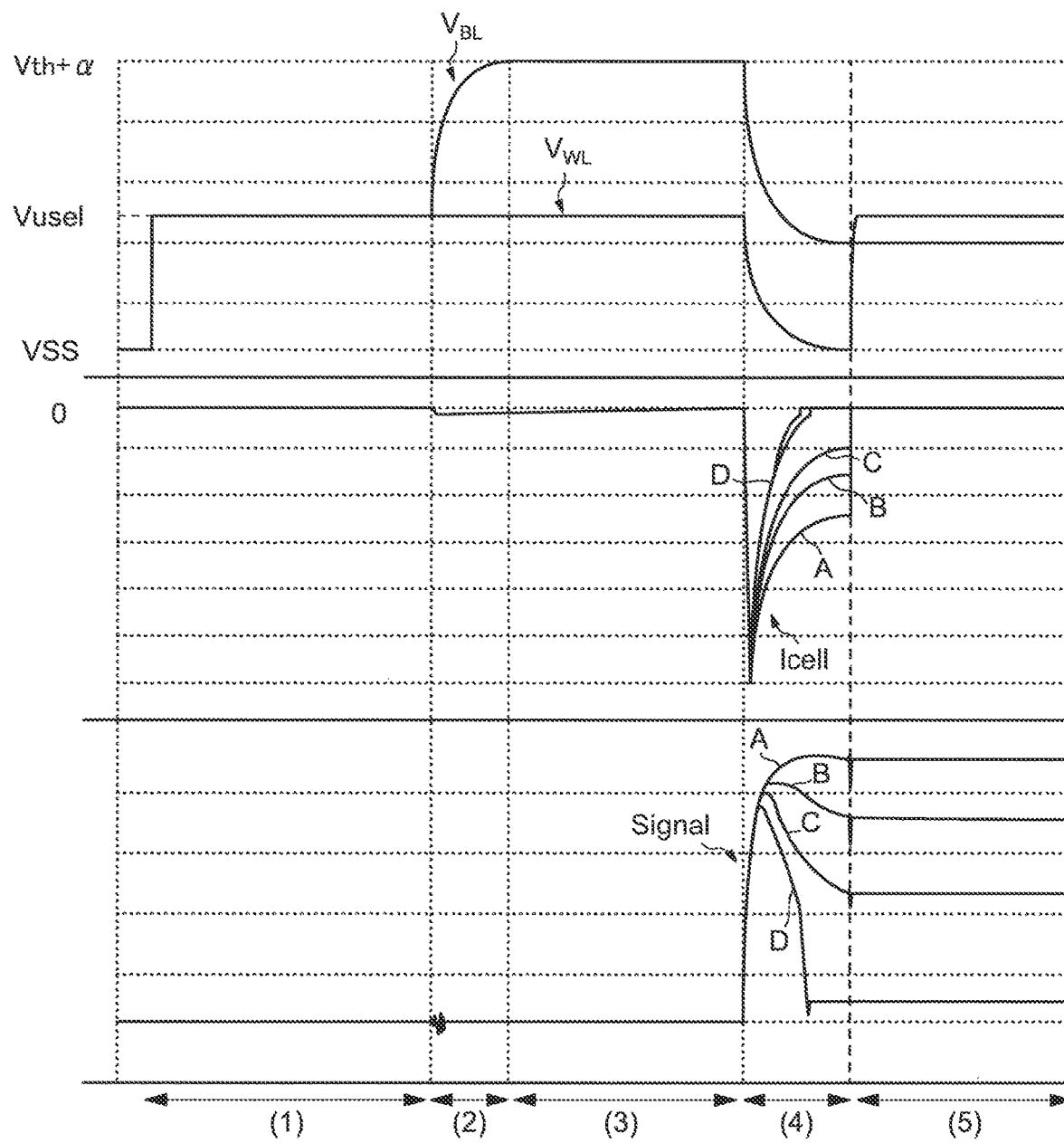
FIG. 10 is a diagram showing a simulation result of a read operation of a memory system according to an embodiment.

FIG. 10 is a diagram showing a simulation result of a read operation of a memory system according to an embodiment. Although FIG. 10 is similar to FIG. 8, a plurality of simulation results according to the magnitude of the constant current Iconst set in the constant current circuit CC in the memory cell current Icell and the read signal strength are displayed. In FIG. 10, "A" is a simulation result in the case where the constant current Iconst is the largest among a plurality of conditions. "B" is a simulation result in the case where the constant current Iconst is smaller than "A", and "C" is a simulation result in the case where the constant current Iconst is smaller than "B". "D" is a simulation result in the case where the constant current circuit CC is not provided (or not functioning). The periods (1) to (5) shown on the horizontal axis in FIG. 10 are the same as the periods (1) to (5) in FIG. 8. Although the simulation results A to D exist with respect to the bit-line potential $V_{BL}$ and the word-line potential $V_{WL}$, only the simulation result D is shown for convenience of explanation.

As shown in the period (4) in FIG. 10, in a transient state, in any of the conditions A to D, the memory cell current Icell gradually decreases after the peak current is appeared. On the other hand, the value at which the memory cell current Icell is stabilized is different depending on the conditions A to D. Furthermore, in the condition D, when the memory cell current Icell reaches the hold current Ihold, the switching element 102 is switched to the high-resistance state, so that the memory cell current Icell is interrupted in the middle of the period (4). On the other hand, in the conditions A to C, the constant current Iconst supplied from the constant current circuit CC continues to be supplied, so that the switching element 102 is not switched to the high-resistance state in the period (4). Under these conditions, the switching element 102 of the memory cell MC is forcibly switched from the low-resistance state to the high-resistance state by supplying the voltage Vusel to the word line WL (period (5)).

Figure 11:
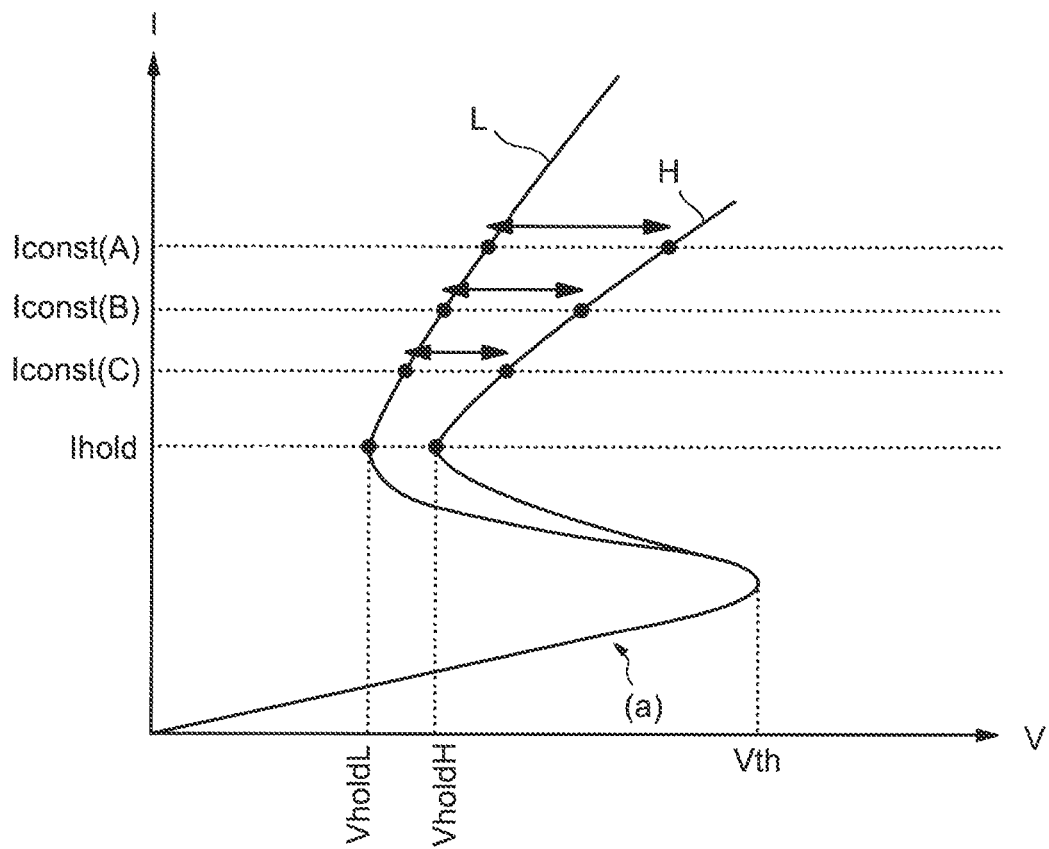
FIG. 11 is a diagram showing electrical characteristics of a memory cell in a read operation according to an embodiment.

FIG. 11 is a diagram showing electrical characteristics of a memory cell in a read operation according to an embodiment. As shown in FIG. 11, the greater the current, the greater the difference between the read voltages VreadL and VreadH. Therefore, the larger the value of the constant current Iconst, the greater the read signal strength (see Signal in FIG. 10). As a result, a stable read operation can be realized.

In the case where the capacitance formed in the bit line BL is large, the transient state described in the first embodiment is relatively longer than in the case where the capacitance is small. Therefore, the switching element 102 of the memory cell MC is forcibly switched to the high-resistance state in the middle of the transient state, thereby improving the read signal strength is easily realized. However, in order to suppress the occurrence of the above peak current, when reducing the capacitance formed in the bit line BL, the transient state is relatively shortened. Therefore, it is difficult to forcibly switch the switching element 102 to the high-resistance state in the middle of the transient state. According to the configuration of the present embodiment, even after the transient state is finished, the memory cell current Icell becomes the constant current Iconst, so that the read signal strength can be ensured.

3. Third Embodiment

Figure 12:
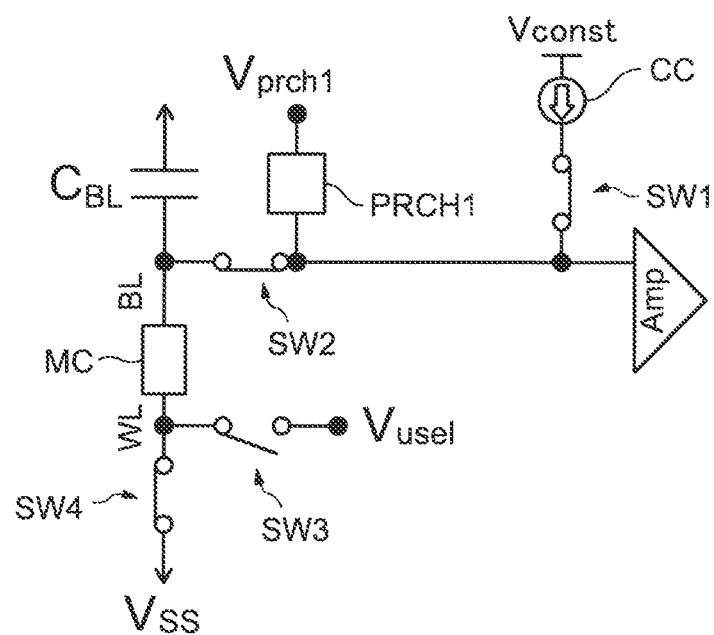
FIG. 12 is a diagram showing a configuration of a read circuit included in a memory system according to an embodiment.

The memory system 1 according to the third embodiment will be described with reference to FIG. 12 to FIG. 13. The memory system according to the third embodiment is similar to the memory system according to the second embodiment. In the following description, a description of the same configuration as that of the memory system according to the second embodiment will be omitted, and mainly, differences from the memory system of the second embodiment will be described.

In the present embodiment, the circuit that executes the read operation will be described in more detail. FIG. 12 is a diagram showing a configuration of a read circuit included in a memory system according to an embodiment. As shown in FIG. 12, the bit line BL is connected to a pre-charge circuit PRCH1, the constant current circuit CC, and an amplifier Amp via a switch SW2. The constant current circuit CC is connected to the pre-charge circuit PRCH1 and the amplifier Amp via the switch SW1. The amplifier Amp is used in detecting the read voltage Vread. The bit line BL is connected to a bit-line capacitance $C_{BL}$. The bit-line capacitance $C_{BL}$ may be provided as a capacity element or may be a parasitic capacitance formed on the bit line. The word line WL is connected to the power supply line that supplies the voltage Vusel via a switch SW3 and to the power supply line that supplies the voltage VSS via a switch SW4. The switch SW3 and the switch SW4 may be controlled by respectively inverted signals.

Figure 13:
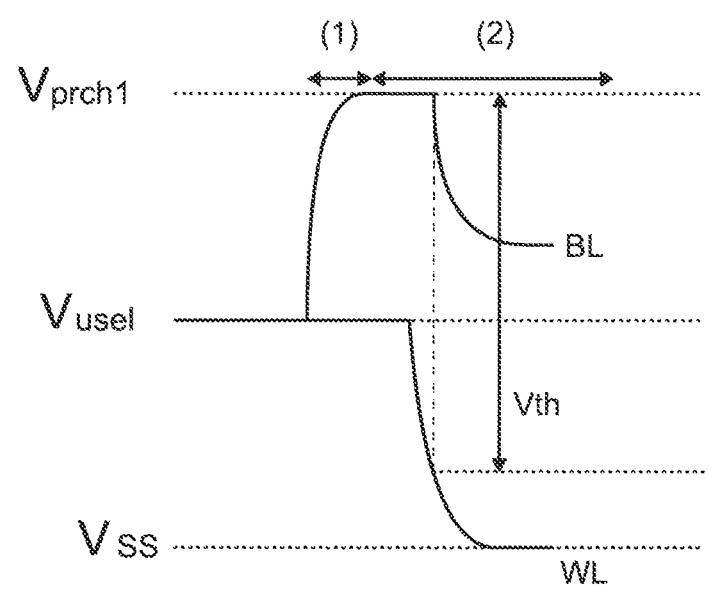
FIG. 13 is a schematic diagram showing a read operation of a memory system according to an embodiment.

FIG. 13 is a schematic diagram showing a read operation of a memory system according to an embodiment. An operation shown in FIG. 13 is substantially the same as the operation of the second embodiment. As shown in FIG. 13, the switch SW2 is turned on and the switch SW1 is turned off in the period (1), so that the bit line BL is pre-charged. The potential of the bit line BL is set to Vprch1 by the pre-charging. The switch SW3 is turned on and the switch SW4 is turned off in the period (1), so that the voltage Vusel is supplied to the word line WL. Next, the switch SW1 is turned on in the period (2), so that the constant current circuit CC is connected to the bit line BL. The switch SW3 is turned off and the switch SW4 is turned on in the period (2), so that the voltage VSS is supplied to the word line WL. When the difference between the bit-line potential $V_{BL}$ and the word-line potential $V_{WL}$ reaches Vth, the switching element 102 included in the memory cell MC is switched from the high-resistance state to the low-resistance state, and the bit-line potential $V_{BL}$ decreases.

4. Fourth Embodiment

The memory system 1 according to the fourth embodiment will be described with reference to FIG. 14 to FIG. 15. The memory system according to the fourth embodiment is similar to the memory system according to the third embodiment.

Figure 14:
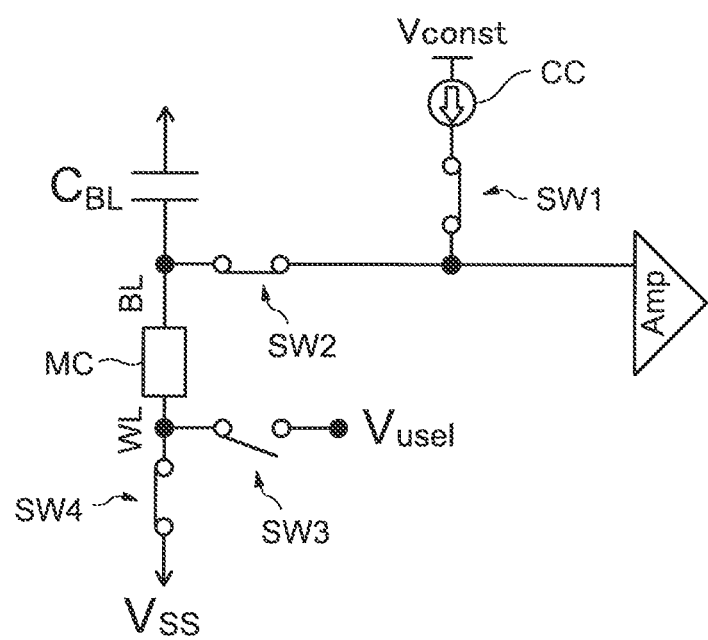
FIG. 14 is a diagram showing a configuration of a read circuit included in a memory system according to an embodiment.

FIG. 14 is a diagram showing a configuration of a read circuit included in a memory system according to an embodiment. As shown in FIG. 14, in the memory system 1 according to the present embodiment, the pre-charge circuit PRCH1 is omitted. In other respects, the configuration in FIG. 14 is the same as that in FIG. 12, and a description thereof is omitted.

Figure 15:
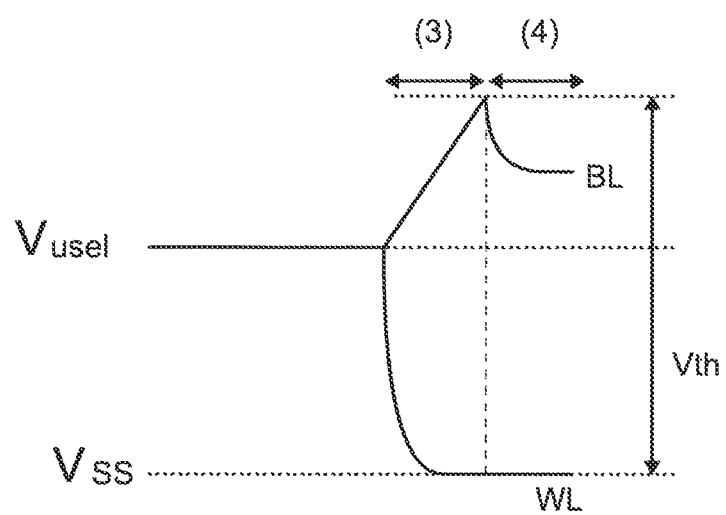
FIG. 15 is a schematic diagram showing a read operation of a memory system according to an embodiment.

FIG. 15 is a schematic diagram showing a read operation of a memory system according to an embodiment. As shown in FIG. 15, pre-charging is not performed in the read operation according to the present embodiment. As shown in FIG. 15, the constant current circuit CC is connected to the bit line BL when the switch SW2 is turned on in the period (3). Furthermore, when the switch SW3 is turned off and the switch SW4 is turned on in the period (3), the voltage VSS is supplied to the word line WL.

Since the voltage VSS is supplied to the word line WL, the word-line potential $V_{WL}$ drops rapidly with the start of the period (3). Since the constant current Iconst is supplied to the bit line BL from the constant current circuit CC, the bit-line potential $V_{BL}$ gradually rises with the start of the period (3). When the difference between the bit-line potential $V_{BL}$ and the word-line potential $V_{WL}$ reaches Vth, the switching element 102 in the memory cell MC switches from the high-resistance state to the low-resistance state, and the bit-line potential $V_{BL}$ drops (period (4)).

As described above, the pre-charge circuit PRCH1 and the pre-charge process can be omitted by using the constant current circuit CC. Therefore, the circuit scale is reduced, and the read operation time is shortened.

While the present embodiment has been described with reference to the drawings, the present embodiment is not limited to the above embodiments, and can be appropriately modified without departing from the spirit of the present embodiment. For example, a memory system of the present embodiment to which a person skilled in the art adds, deletes, or changes the design of components as appropriate based on the memory system of the present embodiment is also included in the scope of the present embodiment as long as the gist of the present embodiment is provided. Furthermore, the embodiments described above can be appropriately combined as long as there is no mutual inconsistency, and technical matters common to the embodiments are included in the embodiments even if they are not explicitly described.

Even if it is other working effects which differ from the working effect brought about by the mode of each above-mentioned embodiment, what is clear from the description in this description, or what can be easily predicted by the person skilled in the art is naturally understood to be brought about by the present embodiment.

What is claimed is:

1. A memory system comprising:
a first wiring extending in a first direction;
a second wiring extending in a second direction intersecting with the first direction;
a memory cell connected to the first wiring and the second wiring between the first wiring and the second wiring, the memory cell including a variable resistance element and a switching element; and
a controller;
wherein
the variable resistance element is switchable between a first low-resistance state and a first high-resistance state,
the switching element is switchable between a second low-resistance state and a second high-resistance state in accordance with a supplied voltage,
a resistance of the second low-resistance state is lower than a resistance of the first low-resistance state,
a resistance of the second high-resistance state is higher than a resistance of the first high-resistance state,
the switching element is a two-terminal type element, and
the controller is configured to
supply the first wiring with a first voltage switching the switching element to the second low-resistance state,
supply the first wiring with a second voltage switching the switching element from the second low-resistance state to the second high-resistance state after the first voltage is supplied, and
detect a first target voltage of the second wiring after the second voltage is supplied.

2. The memory system according to claim 1, wherein
a voltage of the second wiring is varied by a current generated from the second wiring to the first wiring via the switching element in the second low-resistance state, and
the controller supplies the first wiring with the second voltage before the switching element is switched from the second low-resistance state to the second high-resistance state due to a potential difference between the first voltage and a voltage of the second wiring.

3. The memory system according to claim 1, wherein
before the first voltage is supplied to the first wiring, the controller
supplies the first wiring with a third voltage,
supplies the second wiring with a fourth voltage, and
switches the switching element to the second low-resistance state by a potential difference between the first voltage and the fourth voltage,
the switching element is in the second high-resistance state at a potential difference between the third voltage and the fourth voltage.

4. The memory system according to claim 1, further comprising a constant current circuit connected to the second wiring,
wherein the constant current circuit supplies the second wiring with a constant current while the first voltage is supplied to the first wiring.

5. The memory system according to claim 4, wherein the controller stops supplying the constant current from the constant current circuit to the second wiring after the second voltage is supplied to the first wiring.

6. The memory system according to claim 4, wherein the controller
supplies the first wiring with the first voltage, and
increases a voltage of the second wiring until the switching element is switched from the second high-resistance state to the second low-resistance state by supplying the constant current from the constant current circuit to the second wiring.

7. The memory system according to claim 1, wherein the controller detects the first target voltage when the second wiring is in a floating state.

8. The memory system according to claim 1, wherein the controller
sets the variable resistance element to the first low-resistance state or a reference state corresponding to the first high-resistance state by a write operation with respect to the variable resistance element after the first target voltage is detected,
supplies the variable resistance element in the reference state with the second voltage after the first voltage is supplied to the first wiring,
detects a second target voltage of the second wiring, and
decides whether the variable resistance element is in the first low-resistance state or the first high-resistance state by comparing the first target voltage with the second target voltage.

9. The memory system according to claim 1, further comprising an insulating layer arranged between the first wiring and the second wiring in a cross-sectional view.

10. The memory system according to claim 1, wherein the variable resistance element and the switching element are arranged where the first wiring intersects with the second wiring.

11. The memory system according to claim 1, wherein the variable resistance element includes a magnetoresistance effect element.

* * * * *